310-335
10/1/85 OR 4,544,859 SR

United States Patent [19]
Eoff

[11] Patent Number: 4,544,859
[45] Date of Patent: Oct. 1, 1985

[54] NON-BONDED PIEZOELECTRIC ULTRASONIC TRANSDUCER

[75] Inventor: James M. Eoff, Arvada, Colo.

[73] Assignee: The United States of America as represented by the United States Department of Energy, Washington, D.C.

[21] Appl. No.: 628,078

[22] Filed: Jul. 6, 1984

[51] Int. Cl.[4] .......... H01L 41/08
[52] U.S. Cl. .......... 310/335; 310/336; 310/364; 310/800
[58] Field of Search .......... 310/334-337, 310/323, 325, 354-356, 364, 365, 327, 800; 73/642, 644

[56] References Cited

U.S. PATENT DOCUMENTS

| | | | |
|---|---|---|---|
| 1,692,074 | 11/1928 | Burtis | 310/364 |
| 2,078,229 | 4/1937 | Bokovoy et al. | 310/364 X |
| 2,457,563 | 12/1948 | Keller | 310/356 |
| 2,784,325 | 3/1957 | Halliday et al. | 310/336 |
| 2,863,075 | 12/1958 | Fry | 310/335 |
| 3,233,449 | 2/1966 | Harmon | 310/336 X |
| 3,745,829 | 7/1973 | Franchi | 310/335 X |
| 3,890,423 | 6/1975 | Zacharias, Jr. | 310/335 |
| 3,973,152 | 8/1976 | Karplus | 310/335 X |
| 3,995,179 | 11/1976 | Flournoy | 310/335 |
| 4,162,111 | 7/1979 | Brown | 310/336 X |
| 4,296,349 | 10/1981 | Nakanishi | 310/800 X |
| 4,297,607 | 10/1981 | Lynnworth et al. | 310/334 |
| 4,339,683 | 7/1982 | Scott et al. | 310/800 X |
| 4,354,132 | 10/1982 | Borburgh et al. | 310/334 |

OTHER PUBLICATIONS $PVF_2$ Polymer Microprobe, by Wilson et al., *Ultrasonics Symposium,* 1979, pp. 506-510.

*Primary Examiner*—Mark O. Budd
*Attorney, Agent, or Firm*—George H. Libman; Albert Sopp; Judson R. Hightower

[57] ABSTRACT

A mechanically assembled non-bonded ultrasonic transducer includes a substrate, a piezoelectric film, a wetting agent, a thin metal electrode, and a lens held in intimate contact by a mechanical clamp. No epoxy or glue is used in the assembly of this device.

20 Claims, 2 Drawing Figures

NON-BONDED PIEZOELECTRIC ULTRASONIC TRANSDUCER

The United States Government has rights in this invention pursuant to Contract No. DE-AC04-76DP03533 between the Department of Energy and Rockwell International Corporation.

BACKGROUND OF THE INVENTION

The present invention relates generally to an ultrasonic transducer and more particularly to an ultrasonic transducer having a non-bonded piezoelectric film to increase high frequency response and ease of repair.

A common technique for the nondestructive testing of small intricate parts for flaws in their materials, welds, brazes, solid-state bonds, etc. involves the use of high-resolution immersion transducers. For these applications, the device under test is immersed in a tank of water and a transducer is passed over the surface of the device. Ultrasonic pulses from the transducer reflect off the outer and inner surfaces of the device under test and are received by the transducer and analyzed. If a flaw occurs on the hidden side of the device under test, the output from the transducer to a receiver amplifier changes, providing an indication of the flaw.

Existing ultrasonic transducers are constructed from a plurality of layers of different materials bonded together. For example, U.S. Pat. No. 4,296,349 of T. Nakanishi et al. shows a conventional transducer to comprise a piezoelectric film 4 sandwiched by a pair of thin electrodes, with one electrode being bonded to a substrate. An embodiment of this invention shows an additional protector layer of nylon or similar material bonded to the other electrode. The electrode is a metal such as copper or gold which is formed on one surface of the piezoelectric film by means of evaporation, sputtering, or plating. The patent also states that the electrode can be formed by thin metal foil, although no example of such film is given and no structure for forming such a transducer is shown.

U.S. Pat. No. 4,297,607 of L. Lynnworth references a microprobe developed by Wilson et al. and reported in the IEEE 1979 Ultrasonics Symposium Proceedings as having a PVF2 transducer of 30 um. thick coupled directly to a front sealant stainless steel shim (of 25 um.) by a combination of pressure and oil. These construction details are not substantiated by the proceedings, which does indicate that the transducer diameter is 1.5 mm. and that the maximum frequency response of the device was 10 MHz. The small size of the device enables its use in medical applications.

SUMMARY OF THE INVENTION

It is an object of this invention to provide an ultrasonic transducer having a mechanically bonded element which is easily replaceable.

It is another object of this invention to provide an ultrasonic transducer having a piezoelectric element which is not bonded to adjoining electrodes.

It is a further object of this invention to provide an inexpensive 25 MHz ultrasonic transducer.

Additional objects, advantages, and novel features of the invention will become apparent to those skilled in the art upon examination of the following description, or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the ultrasonic transducer of this invention may comprise a substrate having a polished metal end surface, a piezoelectric film having a first side in contact with, but not adhered to said surface, and a second side in contact with, but not adhered to, a thin metal electrode. The electrode may be either placed adjoining or bonded to a plastic lens; a clamp being provided to clamp the lens against the electrode, the electrode against the film, and the film against the substrate. An insulator separates the substrate from a conductive housing. Size of the components is critical to maintain electrical separation of the conductive paths.

BRIEF DESCRIPTION OF THE DRAWINGS

The accompanying drawings, which are incorporated in and form a part of the specification, illustrate an embodiment of the present invention and, together with the description, serve to explain the principles of the invention.

DETAILED DESCRIPTION OF THE INVENTION

Figure 1:
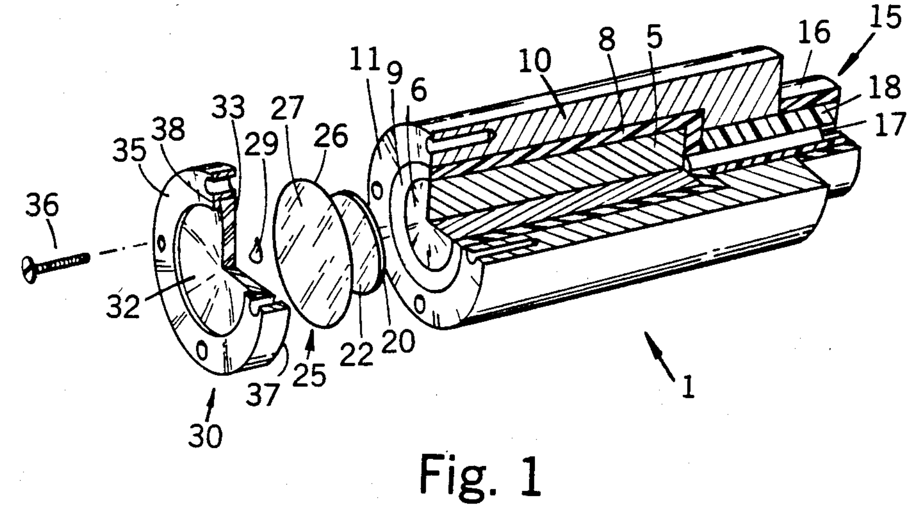
FIG. 1 is an exploded sectional view of a transducer in accordance with this invention.

In accordance with a first embodiment of this invention (shown in FIG. 1), mechanically assembled nonbonded transducer 1 typically includes a substrate 5 having a polished, electrically conductive end surface 6. The body of substrate 5 is surrounded by a layer of electrical insulation 8 having an end portion 9 adjoining end surface 6 and forming a continuation thereof. A housing 10, surrounding insulation 8, includes a first surface 11 adjoining the end portion 9 of the insulation and forming a further continuation of the surface, which also includes end surface 6 of substrate 5.

As also shown in FIG. 1, an electrical connector 15 is connected with an outer conductor 16 electrically connected to first surface 11 of housing 10, and an inner conductor 17 electrically connected to end surface 6 of substrate 5. Insulator 18 insures the electrical separation of the connector conductors.

The active element of transducer 1 is piezoelectric film 20, having a first side 21 (not shown in FIG. 1) and an opposed side 22. The operation of film 20 is the result of mechanical vibrations of the film causing a voltage potential to be developed between opposed sides 21 and 22. Accordingly, it is incumbent upon successful operation of such a transducer that good electrical contact be made between the conductors of connector 15 and the respective sides of film 20.

In accordance with this invention, good electrical contact between side 21 of film 20 and inner conductor 17 of connector 15 is achieved by pressing side 21 through a wetting agent (not shown in FIG. 1) firmly against polished end surface 6 of substrate 5. It is important that end 6 be polished in accordance with conventional machining practices in order to achieve a surface which contacts the entire surface 21. Film 20 is dimensioned such that the edge of side 21 rests entirely on end portion 9 of insulator 8. In addition, to insure good mechanical and electrical contact with side 22 of piezoelectric film 20, first side 26 of thin metal electrode 25 is placed in contact with side 22 of element 20 through a wetting agent (not shown in FIG. 1). Of particular importance in this arrangement is the fact that piezoelectric film 20 is not permanently attached by any means to either of the two metal contact surfaces 6 and 26; rather, it is mechanically held in place and may be easily removed when the mechanical connection is broken.

Contacting opposing side 27 of electrode 25 through a wetting agent 29 is a lens assembly 30 which includes a lens 32 having a polished first surface 33 which conforms to and is held tightly in contact with surface 27 of electrode 25. Wetting agent 29 is shown as a drop, although it would actually be applied as a drop and spread by two contacting surfaces. In addition, lens assembly 30 includes a clamp 35 which provides a mechanical force to hold all the aforementioned elements in contact with one another through conventional means such as screws 36. This force is applied to lens 32 at the edge thereof. Clamp 35 includes an opening having a continuous inner edge surface 37 which is either contiguous with or slightly larger than the outer edge surface of lens 32. Any conventional means, such as a lip 38, may be used to enable clamp 35 to apply pressure against the edge of lens 32.

The electrical connection from side 22 of piezoelectric element 20 to conductor 16 of connector 15 is made through electrode 25, which extends beyond insulator 9 to contact clamp 35 and surface 11 of housing 10.

In one particular embodiment of this invention, housing 10 and clamp 35 were constructed of stainless steel and substrate 5 was constructed of brass. Insulator 8 was machined from Micarta and electrode 25 was constructed of gold foil having a thickness of less than 0.1 um. Lens 32 was constructed of plexiglass to transmit sound energy through a light oil wetting agent to a 10 um PVDF piezoelectric element having a diameter of 5 mm. Performance of this $100 device was comparable to a $1500 commercial device at 25 MHz.

Figure 2:
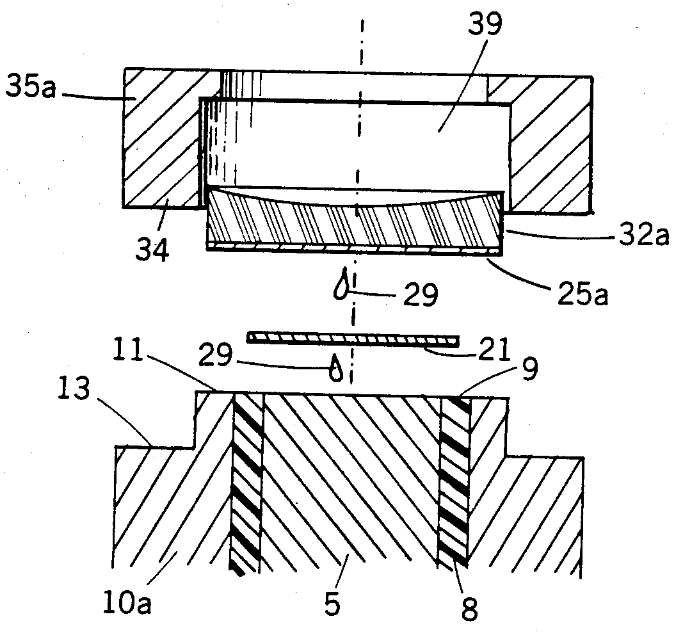
FIG. 2 is an exploded partial view of a second embodiment of the invention.

FIG. 2 shows the arrangement of elements in more detail on a second embodiment of the invention. In this figure, the construction of insulator 8 and substrate 5 is similar to that in FIG. 1. The edge of side 21 of piezoelectric element 20 is clearly seen to contact the end surface 9 of insulator 8, thereby providing electrical contact for side 21 of element 20 only with substrate 5.

In this embodiment housing 10*a* includes a recessed shoulder portion 13 at the outer edge sized to receive an elongate side 34 of clamp 35*a*, thereby ensuring that clamp 35*a* is centered over housing 10*a*.

Another difference between the embodiments of FIG. 1 and FIG. 2 is that electrode 25*a* of FIG. 2 is bonded to the surface of lens 32*a*. The diameter of electrode 25*a* is seen to be larger than the diameter of insulator 8, allowing the edge of electrode 25*a* to contact surface 11 of housing 10*a* when the unit is assembled.

In addition, assembly is completed through clamp 35*a* which includes an opening 39 for surrounding lens 32*a*. Lip 38 provides pressure against an upper surface of lens 32*a* to insure solid contact between surface 6, piezoelectric element 20, and electrode 25*a* when clamp 35*a* is fastened to housing 10*a* by conventional means (not shown).

It should be understood that various modifications of this invention are contemplated. For example, substitution of some materials has been found not to effect performance when using PVDF piezoelectric material. Clamp 35, housing 10 and substrate 5 may be constructed of stainless steel, tungsten, bronze, brass or metal-coated ceramic. Insulator 8 may be any electrically insulating material. Electrode 25 may be gold, silver, aluminum, or various vapor deposited conductors on surface 33 of lens 32. Any noncorrosive wetting agent is suitable, although one with a low viscosity that is not water soluble is preferable. The lens must be a material having an acoustic impedance similar to plexiglass to insure a good impedance match between the PVDF and water. Quartz or ruby lenses may also operate very well, but they were not investigated; of course, they would make the device more expensive. Special attention must also be given to the lens thickness. The allowable minimum thickness, due to design constraints, acts as an acoustic delay line and must be considered when selecting a transducer for any given test. Although the element 20 and its mating surfaces 6 and 26 are shown as flat (i.e. within one plane) in these embodiments, they could also be smoothly curved as long as good, even contact was maintained. In addition, the edge of element 25 may be rectangular for a line-focus tranducer or of other shape as long as surface 9 of insulator 8 has a matching shape to maintain the proper electrical connections between side 21 and substrate 5, and side 22 and electrode 25. Furthermore, it is contemplated that a plurality of discrete elements, each with its own connector, could be incorporated in a single housing in accordance with the invention.

The most critical construction process is grinding or lapping the substrate and lens assemblies for a uniform fit. A good fit is required to achieve the very thin joining interfaces between the substrate, the PVDF, and the lens. Any interfaces of inconsistent or variant thickness appreciably affect the performance characteristics and reduce the efficiency of the device.

Experimental work with other piezoelectric materials such as PZT, $PbNb_2O_6$ and 30-micron PVDF, using the mechanical assembly technique of this invention, has also been tried with moderate success. A thin spacer of lead tape surrounding the piezoelectric element provided the necessary parallel alignment of the clamp and housing.

The particular sizes and materials discussed above are cited merely to illustrate particular embodiments of the invention. It is contemplated that the use of this invention may involve components having different materials and sizes as long as the principles, securing an ultrasonic transducer by mechanical means with the absence of epoxy or glue joint interfaces between the lens, the transducer element and the substrate, is followed. A transducer so constructed will provide an inexpensive, easily modifiable device for the nondestructive testing of thin-walled metal assemblies. It is intended that the scope of the invention be defined by the claims appended hereto.

I claim:

1. A mechanically assembled non-bonded ultrasonic transducer comprising:
   - a substrate having a polished, electrically conductive, end surface;
   - a piezoelectric film having first and second opposed sides, said first side being in contact with, but not adhered to, said surface;
   - a first wetting agent covering said second side of said film;
   - a thin metal electrode having first and second opposed sides, said first side being in contact with, but not adhered to, said second side of said film through said first wetting agent; a second wetting agent covering said second side of said electrode; and a lens assembly comprising:

a lens having a polished first surface in contact with said second side of said electrode through said second wetting agent and clamp means for mechanically clamping said lens against said electrode, said electrode against said film and said film against said substrate.

2. The transducer of claim 1 wherein said lens has a continuous outer edge surface and said clamp means has an opening having a continuous inner edge surface contiguous with said outer edge surface of said lens, said clamp surface retaining said lens against said electrode.

3. The transducer of claim 1 wherein said film has a continuous outer edge surrounding an area, said transducer further comprising:

an electrically insulating material surrounding said substrate and having an end portion adjoining said end surface, the combined area of the end portion of said insulating material and said end surface being larger than the area of said film, the entire edge of said film adjoining the end portion of said insulating material; and a housing surrounding said insulating material; said clamp means being releaseably attached to said housing.

4. The transducer of claim 3 wherein said housing has a first surface adjoining a combined surface defined by said polished end surface of said substrate and the end portion of said insulating material; said clamp being releaseably attached to said first surface.

5. The transducer of claim 4 wherein said combined surface is within one plane.

6. The transducer of claim 3 wherein the area of said film, the area of said substrate end surface, and said lens edge surface each define a circle.

7. The transducer of claim 3 wherein the diameter of said lens is less than 8 millimeters.

8. The transducer of claim 3 wherein said substrate, said housing and said clamp means are made of rigid material having electrically conductive surfaces, said first side of said film being electrically connected to said substrate and insulated from said housing, said second side of said film being electrically connected to said housing and insulated from said substrate.

9. The transducer of claim 8 further comprising an electrical connector having two conductors electrically insulated from each other, the first conductor being electrically connected to said substrate and the second conductor being electrically connected to said housing.

10. The transducer of claim 8 wherein said substrate, said housing and said clamp are made of brass.

11. The transducer of claim 1 wherein said film is PVDF and is less than 11 microns thick.

12. A mechanically assembled ultrasonic transducer comprising:

a substrate having a polished end surface;

a piezoelectric film having first and second opposed sides, said first side being in contact with, but not adhered to, said surface;

a wetting agent covering said second side of said film; and a lens assembly comprising:

a lens having a polished first surface;

a thin metal electrode bonded to said polished first surface;

clamp means for mechanically clamping said electrode against said second side of said film through said wetting agent and said film against said substrate.

13. The transducer of claim 12 wherein said film has a continuous outer edge surrounding an area, said transducer further comprising:

an electrically insulating material surrounding said substrate and having an end portion adjoining said end surface, the combined area of the end portion of said insulating material and said end surface being larger than the area of said film, the entire edge of said film adjoining the end portion of said insulating material; and a housing surrounding said insulating material; said clamp means being releaseably attached to said housing.

14. The transducer of claim 13 wherein said housing has a first surface adjoining a combined surface defined by said polished end surface of said substrate and the end portion of said insulating material; said clamp being releaseably attached to said first surface.

15. The transducer of claim 13 wherein said substrate, said housing and said clamp means are made of a rigid material having electrically conductive surfaces, said first side of said film being electrically connected to said substrate and insulated from said housing, said second side of said film being electrically connected to said housing and insulated from said substrate.

16. The transducer of claim 15 further comprising an electrical connector having two conductors electrically insulated from each other, the first conductor being electrically connected to said substrate and the second conductor being electrically connected to said housing.

17. The transducer of claim 15 wherein said substrate, said housing and said clamp are made of brass.

18. The transducer of claim 13 wherein said lens has a continuous outer edge surface and said clamp means has an opening having a continuous inner edge surface contiguous with said outer edge surface of said lens, said clamp surface retaining said lens against said electrode.

19. The transducer of claim 13 wherein the area of said film, the area of said substrate end surface, and said lens edge surface each define a circle.

20. The transducer of claim 1 wherein said film is PVDF and is less than 11 microns thick.

* * * * *